United States Patent [19]

Nissler et al.

[11] Patent Number: 5,398,008
[45] Date of Patent: Mar. 14, 1995

[54] CIRCUIT ARRANGEMENT FOR AMPLITUDE-MODULATING THE DRIVE SIGNAL OF A LASER

[75] Inventors: Dieter Nissler, Leinfelden-Echterd; Norbert Kaiser, Tamm; Werner Manz, Leinfelden-Echterdingen, all of Germany

[73] Assignee: Alcatel N.V., Netherlands

[21] Appl. No.: 106,877

[22] Filed: Aug. 16, 1993

[30] Foreign Application Priority Data

Aug. 17, 1992 [DE] Germany .......... 42 27 097.9
Aug. 17, 1992 [DE] Germany .......... 42 27 098.7

[51] Int. Cl.⁶ .................. H03C 1/54; H01S 3/13
[52] U.S. Cl. .................. 332/178; 332/152; 359/180; 359/181; 372/8; 372/26; 372/29; 372/31; 372/38
[58] Field of Search .......... 359/180, 181; 332/168, 332/178, 152; 372/8, 26, 29, 31, 38, 34

[56] References Cited

U.S. PATENT DOCUMENTS

| | | | |
|---|---|---|---|
| 4,614,911 | 9/1986 | Kawano | 332/178 X |
| 4,654,607 | 3/1987 | Ishikawa | 332/178 X |
| 4,868,836 | 9/1989 | Howard | 372/38 |
| 4,899,344 | 2/1990 | Shibata et al. | 372/31 |
| 5,038,189 | 8/1991 | Fukudome | 372/38 |
| 5,091,797 | 2/1992 | Proebster | 359/187 |
| 5,095,290 | 3/1992 | Sevenhans et al. | 332/152 |
| 5,115,147 | 5/1992 | Kusano et al. | 307/311 |
| 5,175,722 | 12/1992 | Minami et al. | 372/29 X |
| 5,191,589 | 3/1993 | Amano et al. | 372/38 |
| 5,297,157 | 3/1994 | Kaiser et al. | 372/38 |

FOREIGN PATENT DOCUMENTS

| | | | |
|---|---|---|---|
| 3508034 | 9/1986 | Germany | 372/38 |
| 3614691 | 11/1987 | Germany | |
| 0113546 | 6/1985 | Japan | 359/180 |
| 0182866 | 7/1989 | Japan | 372/26 |
| 0001730 | 1/1991 | Japan | 359/180 |
| 3-278728 | 12/1991 | Japan | 359/180 |
| 3-283926 | 12/1991 | Japan | 359/180 |

OTHER PUBLICATIONS

"Laser Level Control for High Bit Rate Optical Fibre Systems" by D. W. Smith and T. G. Hodgkinson, 1980 IEEE, pp. 926–930.

*Primary Examiner*—Robert J. Pascal
*Assistant Examiner*—Arnold Kinkead
*Attorney, Agent, or Firm*—Ware, Fressola, Van Der Sluys & Adolphson

[57] ABSTRACT

The universally-applicable circuit arrangement of the invention makes possible an adjustment procedure for holding emitted optical power of a laser constant independent of temperature and aging. This circuit arrangement may be carried out as a three-stage cascade circuit supplied with operating voltages greater than 5 V. In accordance with the purpose of the invention, a circuit arrangement is provided which is universally applicable in a temperature range $T = -40°$ C. to $100°$ C. for commercially available lasers and can be supplied by a standard 5 V source. In order to accomplish this as per the invention, differential amplifiers acting as current switches are arranged in a first cascade stage and the current sources feeding the differential amplifiers arranged in a second cascade stage. A data signal (D) serving to control the modulating current ($I_{mod}$) is logically combined with a pilot signal (P) serving to control the pilot currents ($I_{P1}$, $I_{P2}$) in at least one cascade stage.

9 Claims, 8 Drawing Sheets

CIRCUIT ARRANGEMENT FOR AMPLITUDE-MODULATING THE DRIVE SIGNAL OF A LASER

TECHNICAL FIELD

The invention relates to a circuit arrangement, for amplitude-modulating the drive signal of a laser, which is positioned as an electro-optical converter in transmitter stages of optical communications systems for digital transmission signals.

BACKGROUND OF THE INVENTION

In employing the laser in high bit rate transmission systems, the turn-on time, which is dependent on the prior firing history of the laser, interferes, leading to a bit pattern effect. The light pulse to be transmitted is released only after a certain switching delay. In order to lessen this delay, the laser is operated with a bias current which is approximately equal to the threshold current of the laser. The threshold current and the rise of the portion of the characteristic curve of the laser vary due to temperature and the influence of aging. But the bias current is to remain approximately equal to the threshold current, independent of these influences. In order for this to take place, it is necessary to recognize the alteration of the threshold current and correspondingly readjust the bias current. In addition, the average optical power must be held constant, independent of these influences, in order to insure constant system data. In order for this to take place, the alteration of the slope of the characteristic curve must be recognized in order to then correspondingly readjust a modulating current combined with the bias current. The emitted optical power becomes independent of temperature and aging through a separate adjustment of the bias current and modulating current. A procedure has been indicated for this purpose for which a low frequency pilot signal is modulated on the actual data signal, compare Smith, D. W. and Hodgkinson, T. G.: "Laser level control for high bit rate optical fiber systems", Proc. of IEEE, 13th International Symposium on Circuits and Systems, 28th to 30th April 1980, Houston, Tex., pages 926 through 930. The manipulated variables of bias current and modulating current are determined by evaluation of the amplification of the pilot signal, dependent on operating point of the laser, as well as evaluation of the average optical power. The amplitude of the bias current is adjusted at the inflection region of the characteristic curve of the laser, e.g., the bias current is adjusted to approximately the value of the threshold current.

A circuit arrangement is also known, in which a pilot current is combined with the bias current and the modulating current of the laser, compare DE 3,508,034. The circuit arrangement consists of a three stage cascade. The laser as load is connected in series to the transistors of the cascade. The first stage is switched corresponding to the level of the data signal; the second stage is switched according to the level of the pilot signal. The third stage consists of current-controlled current sources, so-called current mirrors, the image factors of which are determined by negative feedback with emitter resistors.

In order to maintain a powerful reverse feedback and a stable current injection for the differential amplifiers of the first and second cascade stages, the emitter resistance of the current sources must be selected to be much greater than the reciprocal value of the transistor steepness. The resulting voltage drop at the emitter resistor sharply reduces the collector-emitter voltages of the transistors in the differential amplifiers and the current sources for a given supply voltage, so that the transistors reach the state of saturation.

The output current of the current sources remains constant as long as the transistors are not overloaded. The current switches realized by means of the differential amplifiers have a good dynamic behavior with reference to response time and jitter only if the transistors do not reach the state of saturation. For solid-state integrated circuits with transistors in the state of saturation, the influence of the parasitic substrate transistor then becoming conductive can no longer be neglected. The circuit no longer operates dependably and can break down entirely. Following from these conditions for this circuit arrangement is the problem of regulating the operating points of the individual transistors such that an optimum optical diagram with minimal time jitter results. The number of stages in a cascade is consequently limited for a given supply voltage if the transistors are not to reach the saturation region. The following conditions should be fulfilled:

$$U_F + n \cdot U_{BE} + U_{RE} \times V_{EE},$$

where
 $U_F$ = forward voltage of the laser,
 $U_{BE}$ = base-emitter-voltage of a transistor,
 $U_{RE}$ = voltage drop at the emitter resistor of a current source,
 $V_{EE}$ = supply voltage, and
 n = number of stages of the cascade.

In dimensioning this type of circuit arrangement it is to be considered that the forward voltage of a laser can amount to, according to type, up to 2.5 V. Likewise the negative temperature coefficient of the base-emitter-voltage of the transistors has an unfavorable effect on the function of the circuit arrangement. Thus, for example, the base-emitter voltage of monolithic integrated HF transistors increases at −40° C. up to 950 mV for a given collector current. Taking into consideration a typical voltage drop of 400 mV at the emitter resistor of a current source, a dependable function with a standard 5 V source cannot be insured for the three stage cascade indicated. Rather, a separate supply voltage must be generated within an optical transmitter with a DC/DC converter for this type of amplitude modulator.

DISCLOSURE OF INVENTION

An object of the present invention is to provide a circuit arrangement for amplitude-modulating the drive signal of a laser which can be universally used in commercially available semiconductor lasers.

Another object of the present invention is to provide such a circuit arrangement which can be supplied by a standard 5 V source and which is to be realized as a solid state integrated circuit.

These objects are solved, according to the invention, by a circuit arrangement for amplitude-modulating the drive signal of a laser (LD), comprising a cascade of differential amplifiers and current sources which amplitude-modulates the modulating current ($I_{mod}$) of the laser (LD) with two pilot currents ($I_{P1}$, $I_{P2}$), wherein a first cascade stage includes differential amplifiers acting as current switches, wherein a second cascade stage includes the current sources feeding the differential amplifiers, and wherein in at least one cascade stage, a data signal (D) serving to control the modulating current ($I_{mod}$) is logically combined with a pilot signal (P) serving to control the pilot currents ($I_{P1}$, $I_{P2}$).

The essence of the invention consists in logically combining the data signal and the pilot signal in a two stage cascade such that bias current, modulating current and the two pilot currents to the laser current of the semiconductor laser are combined in such a fashion that the optical output signal of the semiconductor laser is amplitude-modulated symmetrically and in opposite phase and that the average optical output power of the semiconductor laser is constant.

In a first circuit variant, the differential amplifiers of the laser driver operating as the current switches are respectively activated contingent upon the logical combination of the data signal with the pilot signal on the current switch level and are fed by the voltage-controlled current sources arranged on a second level. This one current switch level is the only signal level with a direct logical combination of data signal and pilot signal.

In a second circuit variant, the differential amplifiers are controlled by the data signal and the voltage-controlled current sources connected contingent upon the pilot signal.

If deviation occurs from the operating point of the semiconductor laser regulated in this way, a control signal is derived from the average optical output power oscillating with the frequency of the pilot signal; this control signal is used to readjust the current combined with the laser current such that the original average optical output power is again reached. The circuit arrangement per the invention enables an extremely precise synchronization of modulating current and two pilot currents, always insuring an amplitude modulation of the optical output signal with no need for adjustment and independent of temperature and insuring a constant average optical output power of the semiconductor laser over the entire operating temperature range. A two stage cascade circuit only, of very simple construction, enables the transistors of the differential amplifiers and of the voltage-controlled current sources to operate outside of their saturation region and without curtailment of their switching speed, even under worst-case conditions, with the use of a standard 5 V source and in a temperature range of T = $-40°$ C. to $100°$ C. The pilot signal, as well as the data signal, can be transmitted at high frequency.

A superior pulse wave shape of the transmitted signal in comparison to known circuit arrangements is achieved with a circuit arrangement according to the invention. The circuit arrangement can be realized with npn-transistors of standardized technology and can be integrated completely monolithically. In this case, the comparatively limited supply voltage is advantageous as it contributes to an increase in the dependability of the circuit arrangement by means of the decreased power consumption. Systematically extending the circuit arrangement from two input variables to n input variable for a maximum $2^n$ states of the optical output signal can be done without difficulty.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
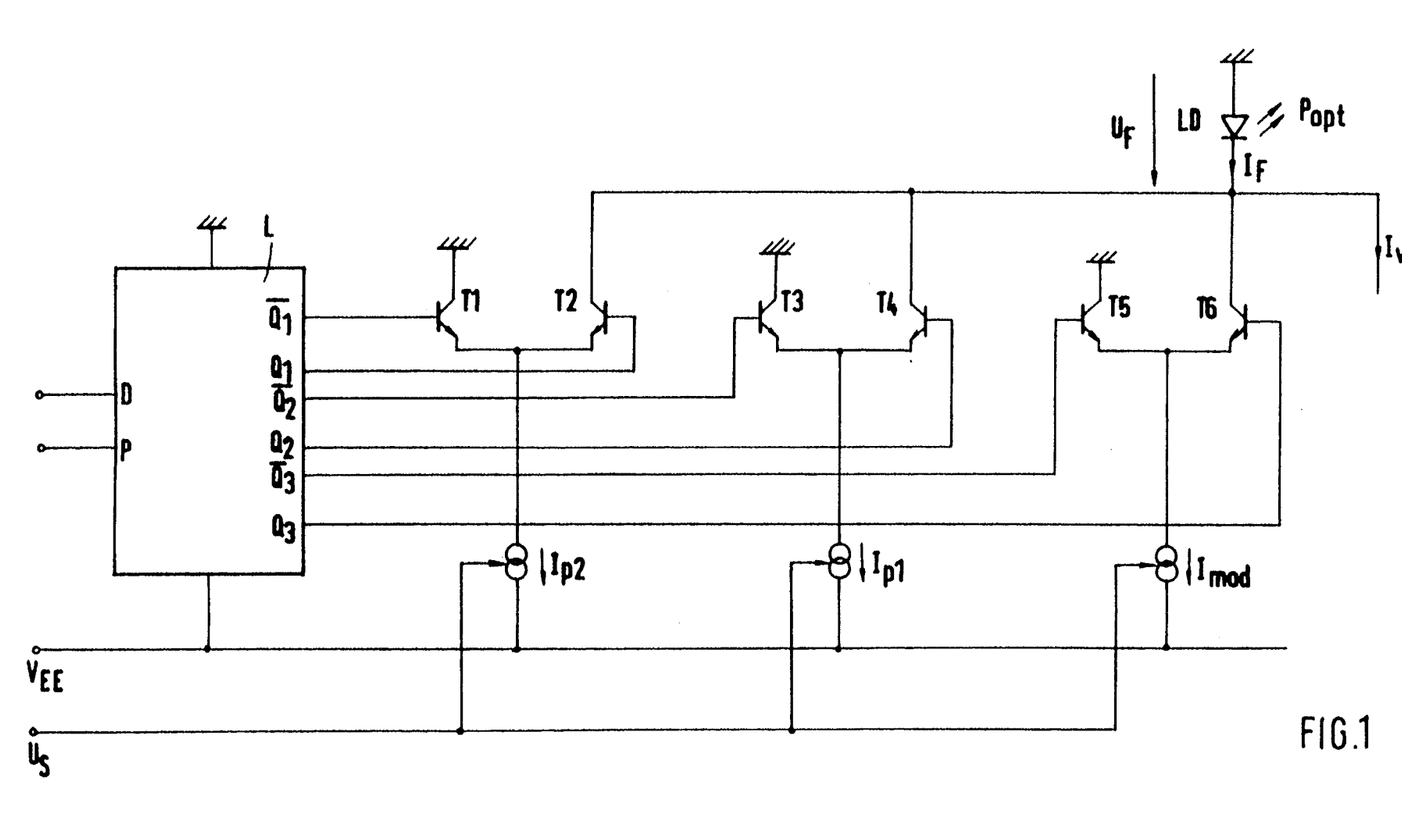
FIG. 1 a basic circuit diagram of a circuit arrangement, according to the invention, with a logical circuit.

In accordance with FIG. 1, the circuit arrangement for amplitude-modulating the drive signal of a semiconductor laser (LD) in a first circuit variant consists of a first differential amplifier (T1, T2), a second differential amplifier (T3, T4) and a third differential amplifier (T5, T6) each with an associated respective first voltage-controlled current source ($I_{P2}$), a second voltage-controlled current source ($I_{P1}$) and a third voltage-controlled current source ($I_{mod}$) as well as a logical circuit (L).

The three differential amplifiers are connected in parallel on the output side. The first common terminal of the collectors is then applied via the semiconductor laser (LD) to the first pole of the operating voltage source. The second common terminal of the collectors is applied directly to the first pole of the operating voltage source; it is however also possible if required, to connect the collector terminals each via a resistor with the first pole of the operating voltage source. The differential amplifiers are controlled at the input side by the logical circuit (L). The logical circuit (L) combines the data signal (D) with the pilot signal (P) in such a fashion that the transistors of the differential amplifiers operating as current switches in large-signal operation switch the two pilot currents ($I_{P1}$, $I_{P2}$) and the modulating current ($I_{mod}$) to the semiconductor laser (LD) such that the optical output power ($P_{opt}$) is amplitude modulated in opposite phase. The voltage-controlled current sources ($I_{P1}$, $I_{P2}$, $I_{mod}$) are jointly controlled by a control voltage ($U_S$).

Figure 2:
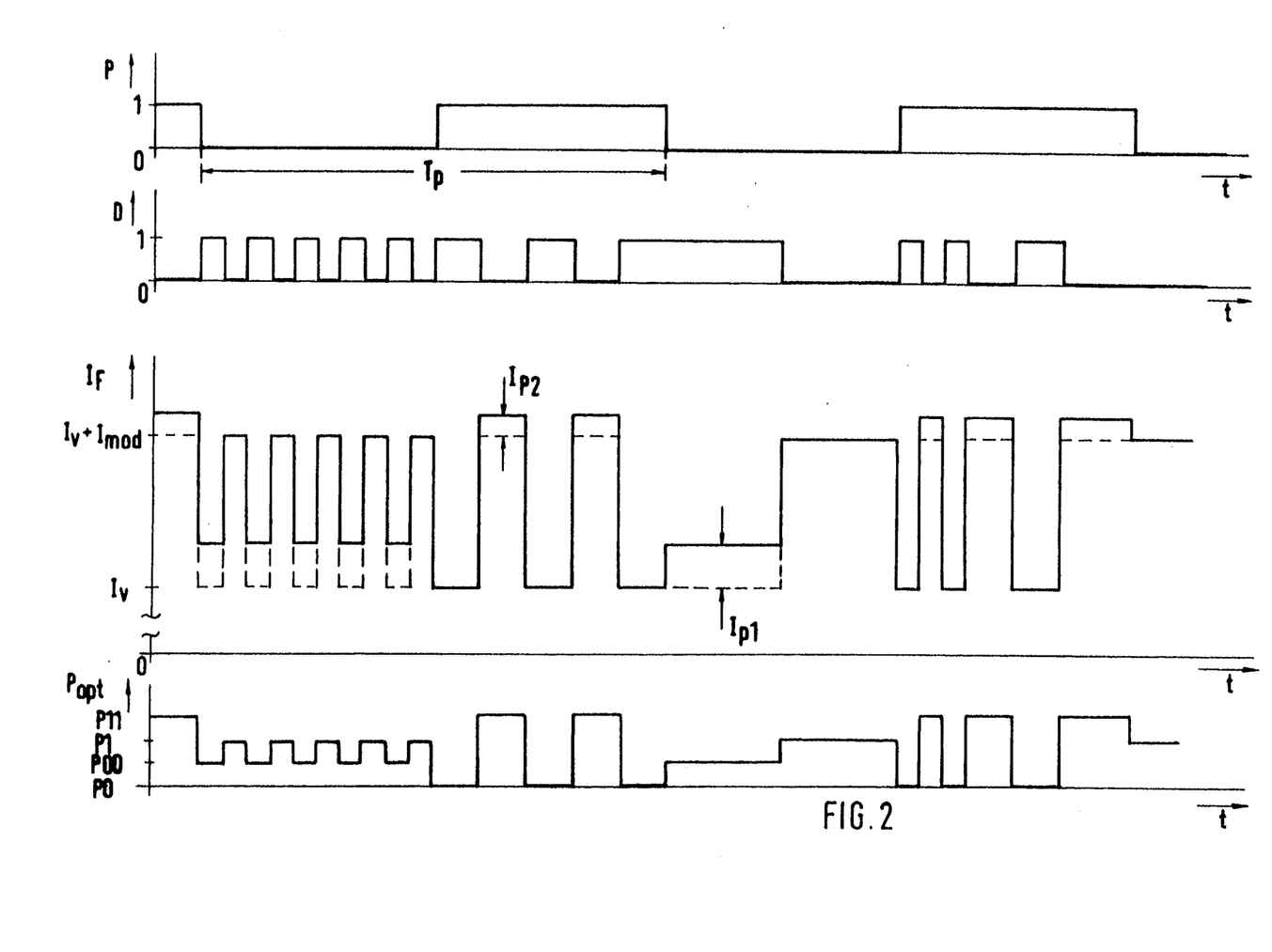
FIG. 2 a timing chart of a pilot signal, an exemplary data signal, an amplitude modulated laser current and a representation of the four states of the optical output power, according to the invention.

FIG. 2 shows the temporal progression of the laser current ($I_F$) as a function of the data signal (D) and the pilot signal (P) for an exemplary pulse model. The four current components ($I_V$, $I_{P1}$, $I_{P2}$, $I_{mod}$) are combined in the semiconductor laser (LD) to the laser current ($I_F$). At this time the optical output power (P) assumes four states (P0, P1, P00, P11).

Figure 3:
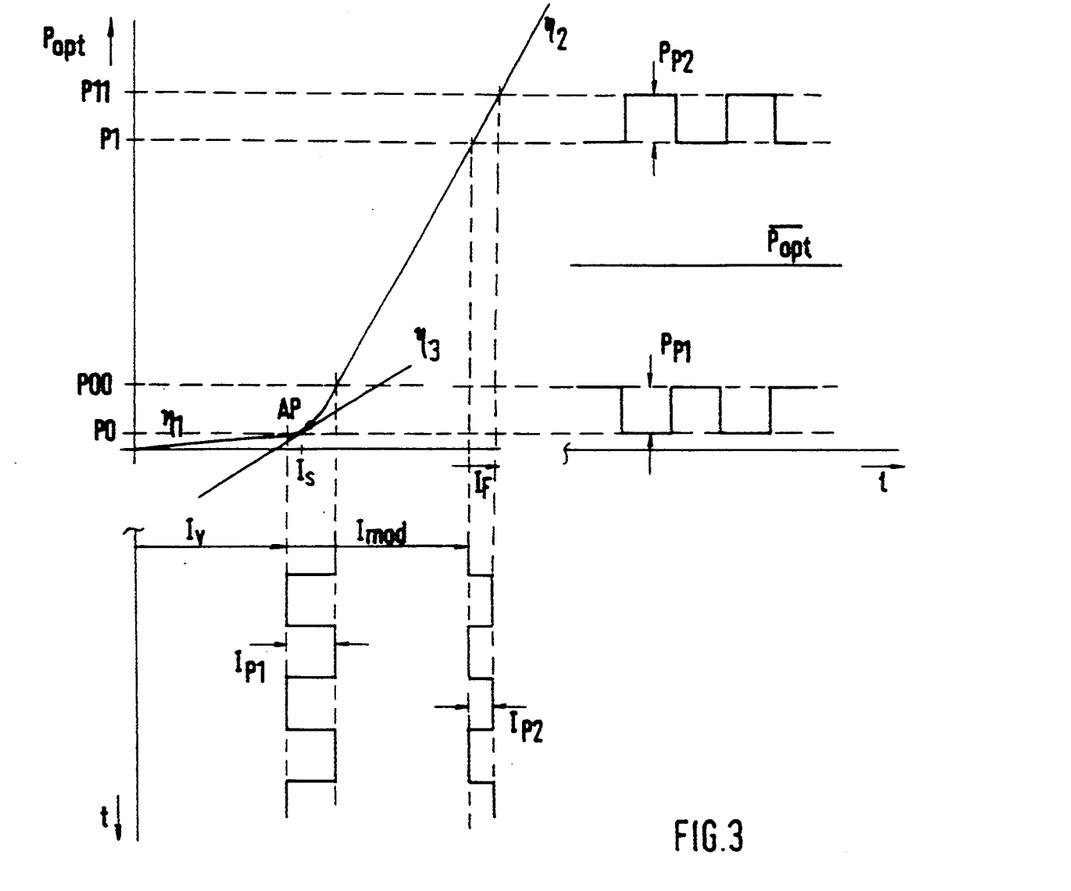
FIG. 3 a laser characteristic curve $P_{opt}=(I_F)$ with the representation of the laser current envelope and of the optical power envelope, according to the invention.

This state of affairs is represented in FIG. 3 with the help of the laser characteristic curve $P_{opt}=(I_F)$. The optical output power ($P_{opt}$) is amplitude modulated symmetrically and in opposite phase. Since the two modulation on ranges ($P_{P1}$, $P_{P2}$) are equal, the average optical output power $\overline{P_{opt}}$ does not vary with the frequency of the pilot signal $f_p = 1/T_p$, so that the spectral component of the pilot signal is not present in the frequency spectrum. This state, represented in FIG. 3, presupposes that all current components are regulated to a defined value. The ratio of the two pilot currents ($I_{P1}:I_{P2}$) corresponds to a ratio $\eta_2:\eta_3$; in the example represented $\eta_2:\eta_3=2:1$, whereby $\eta_2$ is the slope of the laser's characteristic curve in the output range of the upper optical power level (P1) and $\eta_3$ is the average rise of the laser's characteristic curve in output dynamic range of the lower optical power level (P0).

The functional interrelationship of the binary input variables data signal (D) and pilot signal (P) with the four states of the laser current ($I_F$) and the optical output power ($P_{opt}$) for a sample pulse pattern of the data signal (D) and the pilot signal (P) is represented in FIG. 2. The four current components ($I_V$, $I_{mod}$, $I_{P1}$ and $I_{P2}$) combine into the laser current ($I_F$), contingent upon the combinations of the input variables (D) and (P) arbitrarily selected from four possibilities, in such a way that the optical output power ($P_{opt}$) results with the four states (P0, P1, P00 and P11).

| D | P | $I_F$ | $P_{opt}$ |
|---|---|---|---|
| 1 | 1 | $I_V$ | P0 |
| 0 | 0 | $I_V + I_{mod}$ | P1 |
| 1 | 0 | $I_V + I_{P1}$ | P00 |
| 0 | 1 | $I_V + I_{mod} + I_{P2}$ | P11 | with the significances:

| P0 | quiescent power of the optical | "0" |
|---|---|---|
| P1 | quiescent power of the optical | "1" |
| P00 | modulated power of optical | "0" |
| P11 | modulated power of optical | "1" |

The three differential amplifiers (T1, T2; T3, T4; T5, T6) are now driven in such a way as to form the current overlay for the laser current ($I_F$) as indicated above. From this follows the truth table below with the auxiliary variables ($Q_1$, $Q_2$, $Q_3$) associated with the respective differential amplifiers:

| D | P | $P_{opt}$ | $Q_1$ | $Q_2$ | $Q_3$ |
|---|---|---|---|---|---|
| 0 | 0 | P1 | 0 | 0 | 1 |
| 0 | 1 | P11 | 1 | 0 | 1 |
| 1 | 0 | P00 | 0 | 1 | 0 |
| 1 | 1 | P0 | 0 | 0 | 0 |

The following disjunctive standard forms can be derived from the truth table:

$$Q_1 = \overline{D} \cdot P$$
$$Q_2 = D \cdot \overline{P}$$
$$Q_3 = \overline{D} \cdot \overline{P} + \overline{D} \cdot P$$

For $Q_3$ we have $Q_3 = \overline{D}(\overline{P} + P)$
$$= \overline{D}$$

applies.

Figure 4:
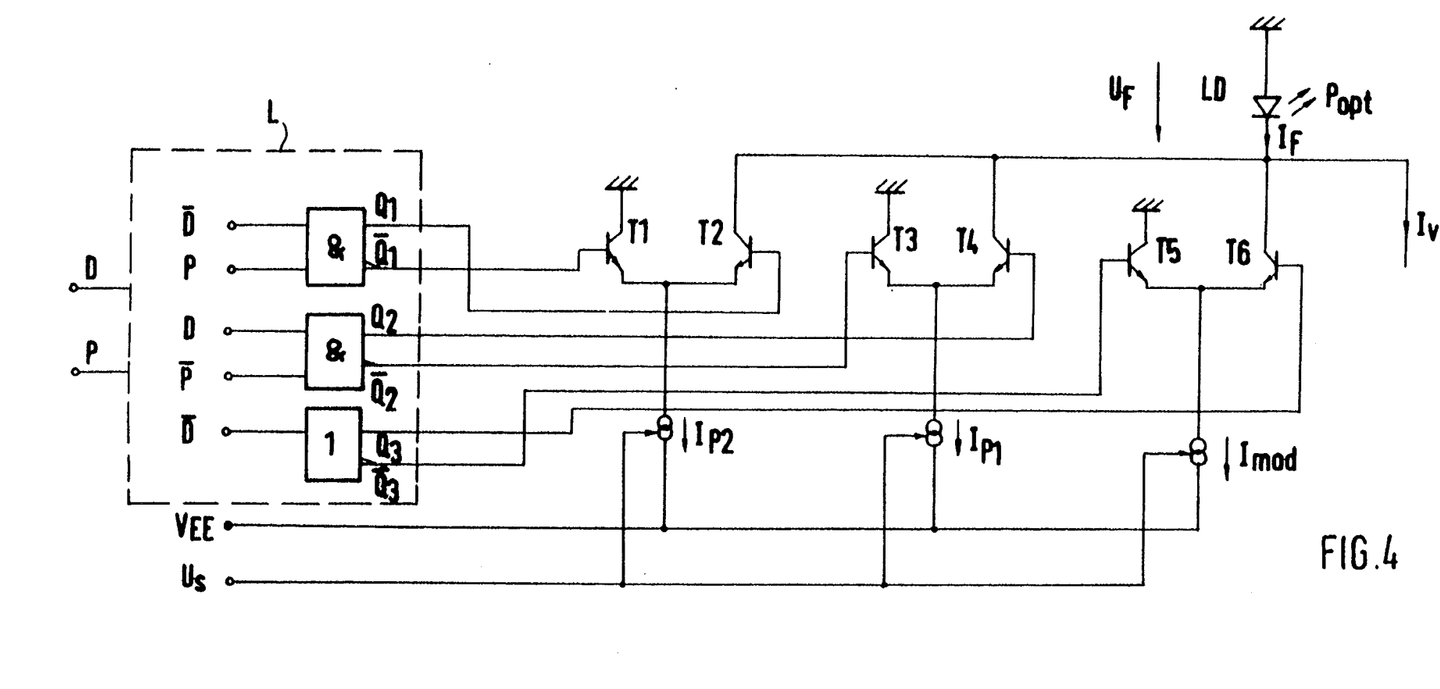
FIG. 4 a circuit arrangement, according to the invention, wherein the logical circuit is realized with AND-gates.

FIG. 4 shows the corresponding circuit realization with AND-gates.

Additional realization possibilities follow from conversions of the aforementioned standard forms with the aid of Boolean algebra, for example $$\overline{Q_1} = \overline{\overline{D} \cdot P} \qquad \overline{Q_2} = \overline{D \cdot \overline{P}}$$
$$= D + \overline{P} \qquad = \overline{D} + P$$

Figure 5:
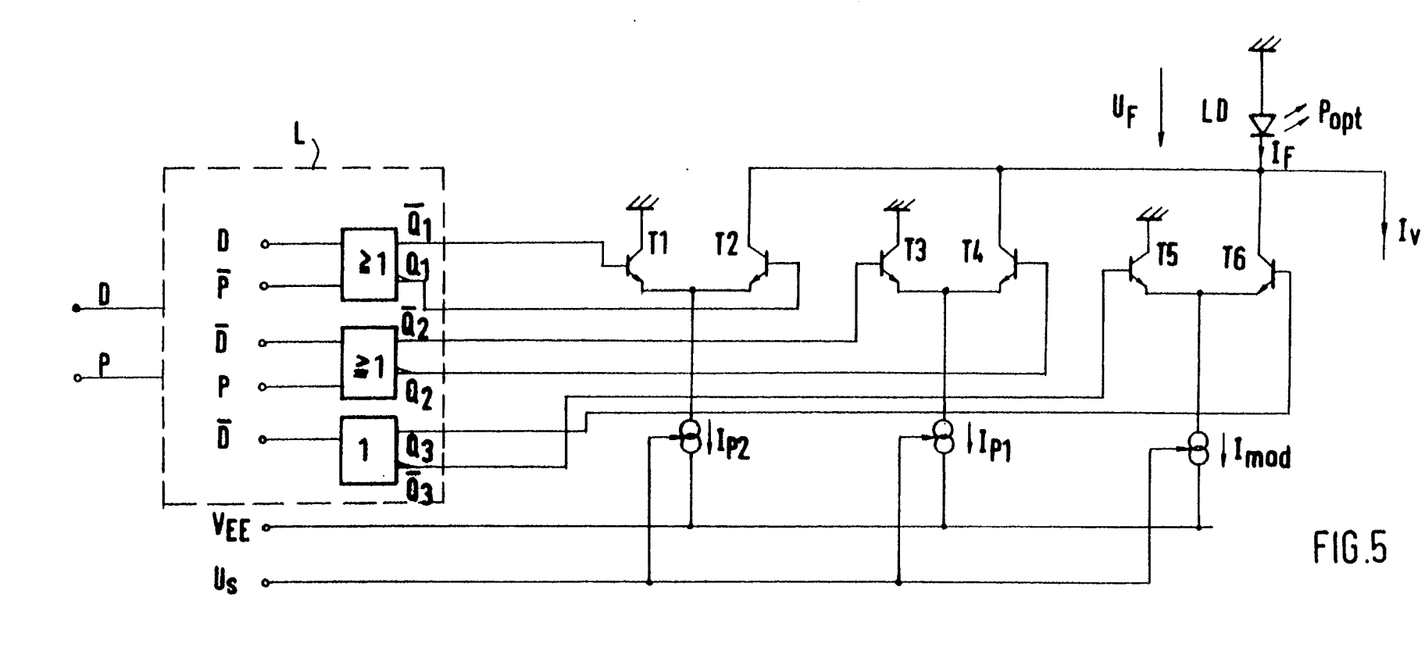
FIG. 5 a circuit arrangement, according to the invention, wherein the logical circuit is realized with OR-gates.

FIG. 5 shows the realization form with OR-gates following from this.

Figure 6:
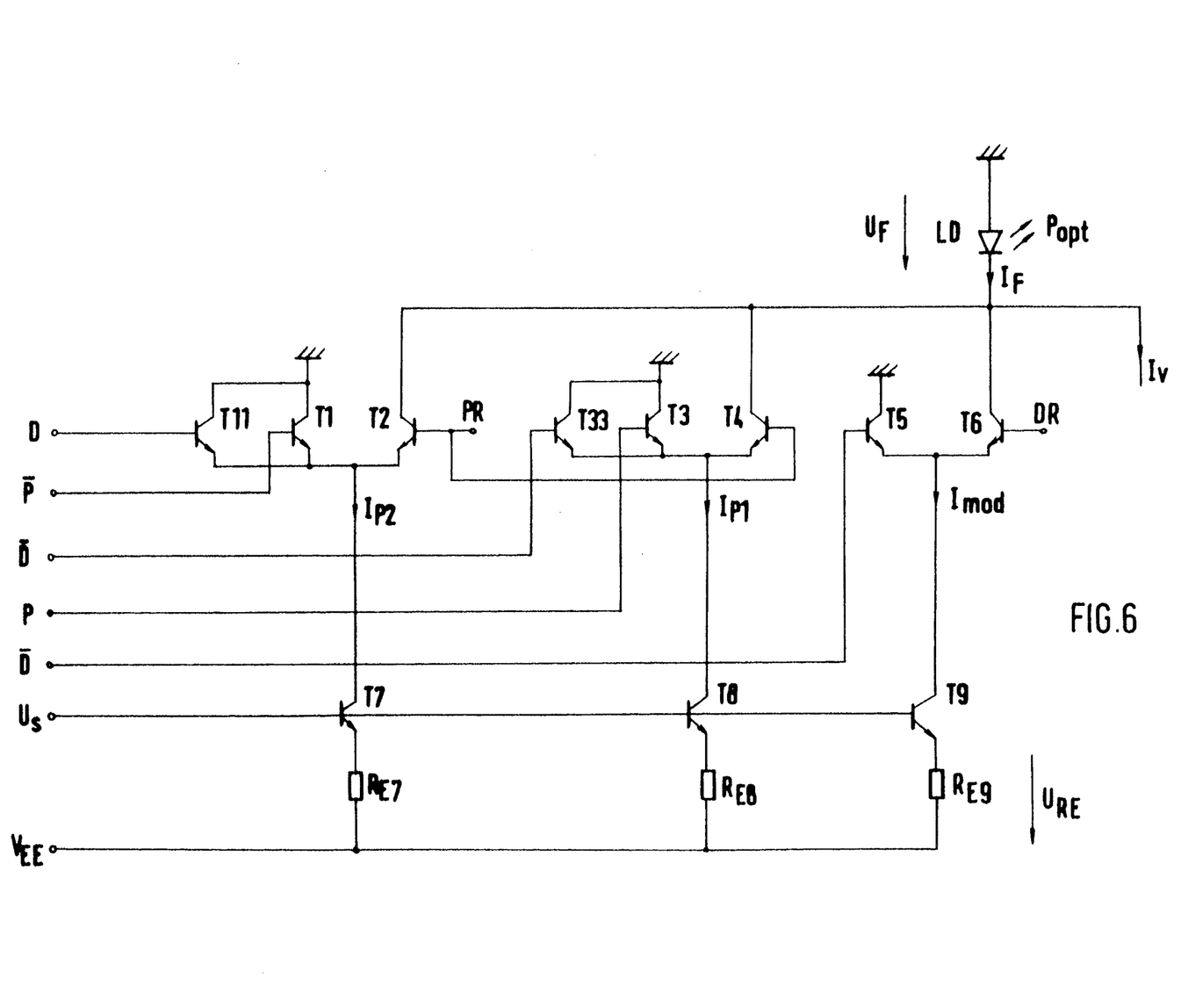
FIG. 6 a detail circuit diagram of a circuit arrangement, according to the invention, with logic circuit.

An advantageous circuit realization of the drive circuit of the semiconductor laser (LD) is represented in FIG. 6. The collector-emitter path of an additional transistor (T11, T33) is connected in parallel to the collector-emitter path of the first transistor (T1) of the first differential amplifier (T1, T2) and the collector-emitter path of the first transistor (T3) of the second differential amplifier (T3, T4) respectively, such that the OR-function can be realized with this arrangement.

The differential amplifiers are each fed by the operating voltage source ($V_{EE}$), via a voltage-controlled current source consisting of a series circuit of a transistor (T7, T8, T9) and an emitter resistor ($R_{E7}$, $R_{E8}$, $R_{E9}$). The ratios of the three currents $I_{mod}:I_{P1}:I_{P2}$ of the voltage-controlled current sources are essentially determined by means of corresponding dimensioning of the respective emitter resistors ($R_{E7}$, $R_{E8}$, $R_{E9}$). In order to attain the required amplitude-modulating of the laser current ($I_F$), the differential amplifiers are driven as follows: The first differential amplifier (T11, T1, T2) which is fed by the second pilot current ($I_{P2}$), is driven via the OR-function of the first input by the data signal (D) and the negated pilot signal ($\overline{P}$); a constant reference signal (PR) is applied to the second input.

The second differential amplifier (T33, T3, T4) which is fed by the first pilot current ($I_{P1}$), is driven via the OR function of the first input by the negated data signal ($\overline{D}$) and from the pilot signal (P); the constant reference signal (PR) is likewise applied to at the second input. The third differential amplifier (T5, T6) is driven at its first input by the data signal ($\overline{D}$); the negated data signal (D) or a constant reference signal (DR) is applied to its second input.

This circuit arrangement has the advantage that the two pilot currents ($I_{P1}$, $I_{P2}$) are placed in readiness for a pilot adjustment particularly easily without interfering with the third differential amplifier (T5, T6) for the modulating current ($I_{mod}$) which switches at a higher speed.

The ratio of the pilot currents ($I_{P1}:I_{P2}$) of FIG. 6 corresponds to the ratio $\eta_2:\eta_3$ (compare FIG. 3). The modulation factor of the amplitude modulation $m = I_{P2}$. :$I_{mod}$ is regulated by the amplitude ratio from the combined second pilot current ($I_{P2}$) and the modulating current ($I_{mod}$). Synchronization of the pilot currents ($I_{P1}$, $I_{P2}$) is attained with extreme precision if the ratio of the emitter areas ($A_{E7}:A_{E9}$) of the transistors (T7, T8) of the first and second voltage-controlled current sources is selected to be equal to the ratio of their associated pilot currents ($I_{P2}:I_{P1}$). The temperature responses of the first and second voltage-controlled current sources are then compensated and the optical output power ($P_{opt}$) of the semiconductor laser (LD) amplitude is modulated without need for adjustment, independent of temperature across the entire operating temperature range, symmetrically and in opposite phase.

If the slope $\eta_2$ of the laser's characteristic curve in the output range of the upper optical power level (P1) changes, then the amplitude modulation of the optical output power ($P_{opt}$) becomes asymmetric, the average optical output power $\overline{(P_{opt})}$ varies with the frequency ($f_p$) of the pilot signal, thereby causing the appearance of the spectral components of the pilot signal in the frequency spectrum. From this is derived a control voltage ($U_S$) via an adjustment circuit, not represented here, with which the three voltage-controlled current sources are driven such that the average optical output power ($P_{opt}$) remains constant independent of the change in the slope ($\eta_2$) of the characteristic curve. In order to do this, the second pilot current ($I_{P2}$) must be altered to the same degree as the modulating current ($I_{mod}$). Synchronization of these currents is achieved with extreme precision if the ratio of the emitter junctions ($A_{E7}:A_{E9}$) of the transistors (T7, T9) of the first and third voltage-controlled current sources is selected to be equal to the corresponding current ratio ($I_{P2}:I_{mod}$).

The temperature responses of the current sources compensate each other and the modulation factor of the amplitude modulation and optical output power ($P_{opt}$) of the semiconductor laser (LD) are adjustment-free and constant, independent of temperature in the entire operating temperature range.

It is possible to make use of the circuit arrangement without difficulty even if the amplitude modulation is to be neither symmetrical nor in opposite phase. According to adjustment procedure and regulation of the bias current ($I_V$) in relationship to the threshold current ($I_S$) of the laser (LD) the ratio of the pilot currents ($I_{P1}:I_{P2}$) can be selected to be different in comparison to the above described example. In a borderline case, a pilot current can come to equal zero. The amplitude-modulation can then be symmetrical and in-phase, asymmetrical and in opposite phase or asymmetrical and in-phase. Since the optical modulation ranges ($P_{P1}$, $P_{P2}$) of the optical output power ($P_{opt}$) are consequently unequal, the average optical output power ($P_{opt}$) varies with the frequency of the pilot signal ($f_p$). The design state therefore exhibits a frequency spectrum component, on the amplitude of which the adjustment procedure can be laid out. With the circuit arrangement described, the number of input variables can be increased from two to an indefinite number (n) according to the application. Correspondingly, the optical output power ($P_{opt}$) with an expanded number of differential amplifiers with associated current sources then takes on not only four states, rather a maximum of $2^n$ states. According to the number (n) of input variables, a maximum of $2^n$ combinations may be indicated, each of which can be combined by means of a differently constructed logical circuit. Corresponding to the circuit arrangement represented in FIG. 6, collector-emitter-paths of additional transistors are connected in parallel to the collector-emitter-paths of the differential amplifiers contingent upon the number of the input variables and contingent upon their logical combination for realization of the OR-function.

Figure 7:
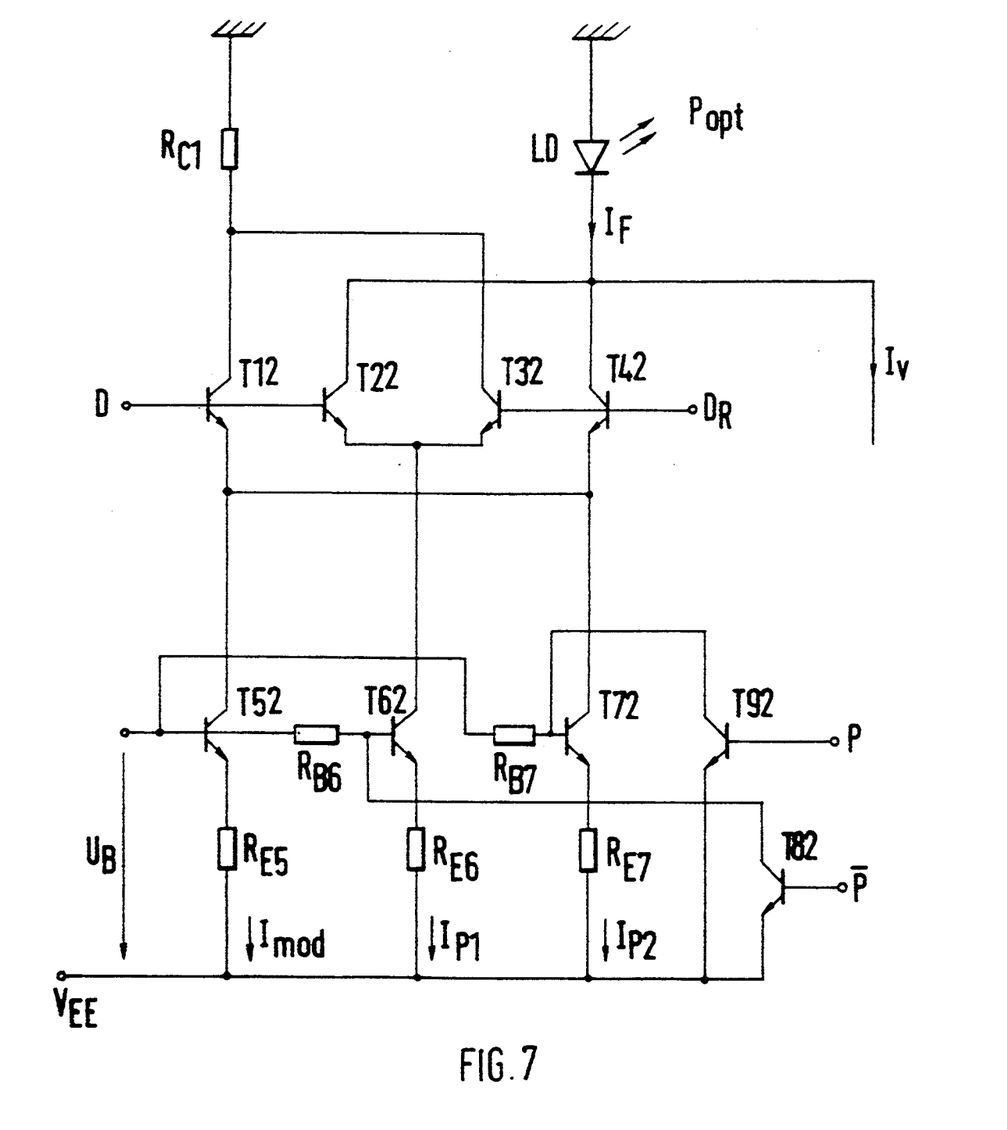
FIG. 7 a circuit diagram of a circuit arrangement, according to the invention, with controlled differential amplifiers and controlled current sources.

FIG. 7 shows a second circuit variant of the circuit arrangement for amplitude-modulating the drive signal of a semiconductor laser (LD), consisting essentially of a first differential amplifier (T12, T42), a second differential amplifier (T22, T32) and a first voltage-controlled current source with a transistor (T52), a second voltage-controlled current source with a transistor (T62) and a third voltage-controlled current source with a transistor (T72) as well as a first and a second transistor stage (T82, T92) for controlling a first and a second pilot current ($I_{P1}$, $I_{P2}$).

The two differential amplifiers (T12, T42; T22, T32) are driven by the data signal to be transmitted. In order to do this, the respective corresponding bases of the transistors (T12, T22, T32, T42), e.g., the first and the second inputs respectively of the differential amplifiers (T12, T42, T22, T32) are connected in parallel. The data signal (D) is applied to the first inputs, and the negated data signal $\overline{D}$ or a constant reference signal ($D_R$) is applied to the second inputs.

The collectors of the transistors (T12, T22, T32, T42) are cross-connected, that is, the first output of the first differential amplifier (T12, T42) is connected to the second output of the second differential amplifier (T22, T32) and the second output of the first differential amplifier (T12, T42) is connected to the first output of the second differential amplifier (T22, T32). The first of the connecting points resulting in this fashion is connected via the laser diode (LD), and the second connecting point connected via a resistor ($R_{C1}$), with the positive potential terminal of an operating voltage source. This resistor ($R_{C1}$) can also be eliminated and replaced by a direct connection.

The differential amplifiers (T12, T42; T22, T32) act as current switches, i.e., in the large-signal operation, and are fed by voltage-controlled current sources. The first differential amplifier (T12, T42) is fed by the first voltage-controlled current source, which supplies a modulating current ($I_{mod}$), and by the third voltage-controlled current source, which supplies the second pilot current (In). The second differential amplifier (T22, T32) is fed by the second voltage-controlled current source, which supplies the first pilot current ($I_{P1}$). The two pilot currents are connected and/or disconnected in opposite phase by means of two pilot signals (P, $\overline{P}$), each the negation of the other; this occurs by the means that each pilot signal acts upon the base of the transistor (T62) of the second voltage-controlled current source and upon the base of the transistor (T72) of the third voltage-controlled current source via a transistor stage (T82, T92). The ratios of the three currents ($I_{mod}:I_{P1}:I_{P2}$) of the voltage-controlled current sources are also determined in this circuit variant essentially by means of a corresponding dimensioning of the respective emitter resistors ($R_{E5}$, $R_{E6}$, $R_{E7}$). The semiconductor laser (LD) is consequently supplied with the bias current ($I_V$), the modulating current ($I_{mod}$) and the pilot currents ($I_{P1}$, $I_{P2}$) by means of the circuit arrangement.

The values of the base series resistors ($R_{B6}$, $R_{B7}$) of the second and third voltage-controlled current source are expediently selected such that on the one hand, the base voltage of the transistor (T52) of the first voltage-controlled current source essentially remains unaltered during switching of the pilot signal and that on the other hand the transistors (T62, T72) of the second and third voltage-controlled current source can be securely blocked by means of the superposed transistor stages (T82, T92). The desire for limited power consumption leads to the selection of the highest-resistance base series resistors ($R_{B6}$, $R_{B7}$) possible.

Synchronization of the pilot currents ($I_{P1}$, $I_{P2}$) is attained with extreme precision if the resistance ratio of the base resistors ($R_{B6}:R_{B7}$) of the transistors (T62, T72) of the second and third voltage-controlled current source are selected to be equal to the inverse ratio of the pilot currents ($I_{P1}:I_{P2}$) associated with the voltage-controlled current sources and if the ratio of the emitter junctions of the cited transistors ($A_{E6}:A_{E7}$) is selected to be equal to the ratio of the pilot currents ($I_{P2}:I_{P2}$) associated with the second and the third current sources. The temperature responses of the second and third voltage-controlled current sources then compensate each other, and the optical output power ($P_{opt}$) of the semiconductor laser (LD) is amplitude-modulated symmetrically and in opposite, without need for adjustment and independent of temperature across the entire operating temperature range.

Figure 8:
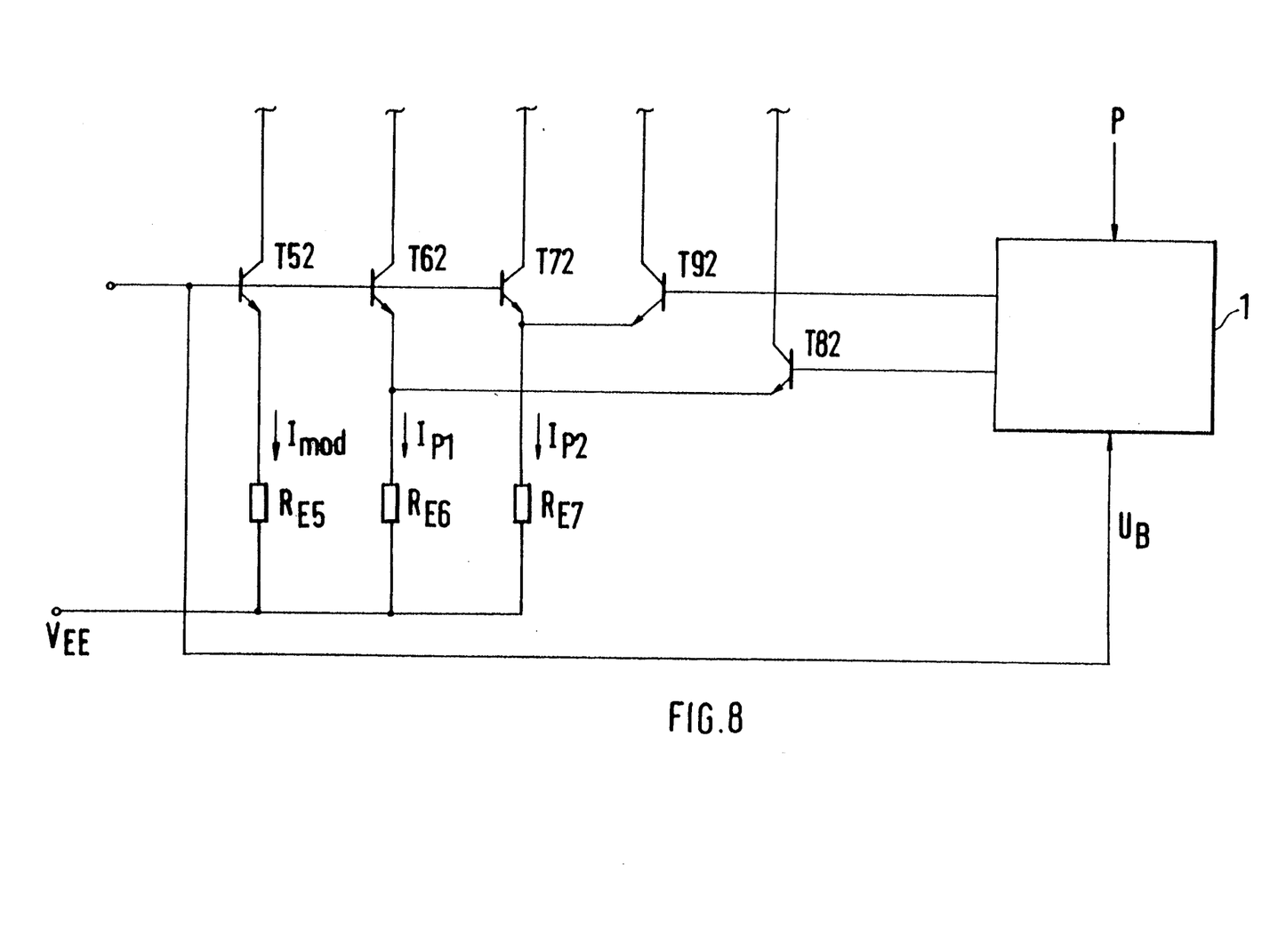
FIG. 8 a section from a circuit diagram for a variant of the circuit arrangement in FIG. 7.

In accordance with FIG. 8, it is possible to trigger the transistors (T62, T72) of the second and third voltage-controlled current sources via the emitters. The base series resistors ($R_{B6}$, $R_{B7}$) are then no longer necessary. An advantage to this circuit variant is the now favorable switching behavior of the transistors (T62, T72), such that the pilot signal frequency can be raised to the magnitude of the frequency of the data signal. The driving of the transistor stages (T82, T92) for the pilot signals must be laid out for maximum base voltage of the transistors (T52, T62, T72) of the voltage-controlled current sources or it may take place, as shown in FIG. 8, via a drive circuit 1 functionally dependent on the control voltage ($U_B$) of the voltage-controlled current sources.

The state of affairs for the first circuit variant, already represented with the help of FIGS. 2 and 3 applies equally to the second circuit variant. The embodiments likewise apply equally for selection of the pilot currents if the amplitude-modulating is not to be symmetrical nor in opposite phase.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A circuit arrangement for amplitude-modulating a drive signal of a laser (LD), comprising a cascade of differential amplifiers and current sources which amplitude-modulates a modulating current ($I_{mod}$) of the laser (LD) with two pilot currents ($I_{P1}$, $I_{P2}$), wherein a first (T1, T2), a second (T3, T4) and a third differential amplifier (T5, T6) are interconnected such that a first output of each differential amplifier is connected to a first pole of an operating voltage source and wherein a second output of each differential amplifier is connected via the laser (LD) to the first pole of the operating voltage source and wherein the inputs of the differential amplifiers (T1, T2; T3, T4; T5, T6) are connected to a combinatorial logical circuit (L) controlled by a data signal (D) and a pilot signal (P) and that the differential amplifiers (T1, T2; T3, T4; T5, T6) are each connected to a second pole of the operating voltage source ($V_{EE}$) via a voltage-controlled current source ($I_{P1}$, $I_{P2}$, $I_{mod}$), wherein the voltage-controlled current sources ($I_{P1}$, $I_{P2}$, $I_{mod}$) are jointly connected at their control inputs to an output of a control circuit, and wherein the differential amplifiers (T1, T2; T3, T4; T5, T6) each comprise a first transistor (T1, T3, T5) and a second transistor (T2, T4, T6), respectively, wherein the collector-emitter path of a third transistor T11, T33) is connected in parallel respectively to the collector-emitter path of the first transistor (T1) of the first differential amplifier (T1, T2) and to the collector-emitter path of the first transistor (T3) of the second differential amplifier (T3, T4) and wherein the base terminals of the transistors of the differential amplifiers are connected as follows: the base of the third transistor (T11) of the first differential amplifier and the base of the first transistor (T5) of the third differential amplifier to the data signal ($\overline{D}$), the base of the first transistor (T1) of the first differential amplifier to a negated pilot signal ($\overline{P}$), the base of the second transistor (T2) of the first differential amplifier and the base of the second transistor (T4) of the second differential amplifier to a constant reference signal (PR), the base of the third transistor (T33) of the second differential amplifier to a negated data signal ($\overline{D}$), the base of the first transistor (T3) of the second differential amplifier to the pilot signal (P) and the base of the second transistor (T6) of the third diffrnetial amplifier to a reference signal ($D_R$) and wherein the voltage-controlled current sources ($I_{P1}$, $I_{P2}$, $I_{mod}$) each comprise a series circuit of a transistor (T7, T8, T9) and an emitter resistor ($R_{E7}$, $R_{E8}$, $R_{E9}$) and wherein the base terminals of these transistors are jointly kept at a control voltage ($U_S$).

2. The circuit arrangement of claim 1, wherein the reference signal ($D_R$) is a constant signal.

3. The circuit arrangement of claim 1, wherein the reference signal ($D_R$) is the negated data signal ($\overline{D}$).

4. The circuit arrangement of claim 1, wherein a number of input variables of the combinatorial logic circuit (L) as well as the number of differential amplifiers and current sources associated with these can be augmented.

5. A circuit arrangement for amplitude-modulating a drive signal of a laser (LD), comprising a cascade of differential amplifiers and current sources which amplitude-modulates a modulating current ($I_{mod}$) of the laser (LD) with two pilot currents ($I_{P1}$, $I_{P2}$), wherein a first (T12, T42) and a second (T22, T32) differential amplifier are arranged in a first cascade stage and wherein the inputs of the first and second differential amplifiers are connected to each other and wherein the outputs of the first and second differential amplifiers are cross-connected such that at a first connecting point a first output of the first differential amplifier (T12, T42) is connected to a second output of the second differential amplifier (T22, T32) and at a second connecting point a second output of the first differential amplifier (T12, T42) is connected to a first output of the second differential amplifier (T22, T32), and wherein the first connecting point is connected via the laser (LD) with a first pole of an operating voltage source, and the second connecting point is connected with the first pole of the operating voltage source, and wherein inputs of the differential amplifiers (T12, T42; T22, T32) are connected to a combinatorial logical circuit (L) controlled by a data signal (D) and a pilot signal (P) and wherein the differential amplifiers (T12, T42; T22, T32) are connected to a second pole of the operating voltage source via a first, a second and a third voltage controlled current source, the second and the third voltage-controlled current source are arranged in a second cascade stage and jointly controlled by means of a control voltage ($U_B$), wherein the first voltage-controlled current source for feeding the modulating current ($I_{mod}$) and the third voltage-controlled current source for feeding a second pilot current ($I_{P2}$) are connected to the first differential amplifier (T12, T42), wherein the second voltage-controlled current source for feeding a first pilot current ($I_{P1}$) is connected to the second differential amplifier (T22, T32) and wherein the second and third voltage-controlled current sources respectively are each alternately activated via a transistor stage (T82, T92) contingent upon the pilot signal (P, $\overline{P}$).

6. The circuit arrangement of claim 5, wherein the control voltage ($U_B$) is located adjacent to the base of the transistor (T52) of the first voltage-controlled current source and located adjacent to the base of the transistors (T62, T72) of the second and third voltage-controlled current source via a resistor ($R_{B6}$, $R_{B7}$) respectively.

7. The circuit arrangement of claim 5, wherein the collectors of the transistors (T52, T72) of the first and third voltage-controlled current sources are connected to the emitters of the transistors (T12, T42) of the first differential amplifier and wherein the collector of the transistor (T62) of the second voltage-controlled current source is connected to the emitters of the transistors (T22, T32) of the second differential amplifier.

8. The circuit arrangement of claim 5, wherein the collector of the transistor (T82) of a first transistor stage is connected to the base of the transistor (T62) of the second voltage-controlled current source and wherein the collector of the transistor (T92) of a second transistor stage is connected to the base of the transistor (T72) of the third voltage-controlled current source and that the emitter of the transistor (T82) of the first transistor stage and the emitter of the transistor (T92) of the second transistor stage respectively are wired to a negative pole of an operating voltage source.

9. The circuit arrangement of claim 5, wherein the emitter of the transistor (T82) of a first transistor stage is connected to the emitter of the transistor (T62) of a second voltage-controlled current source and wherein the emitter of the transistor (T92) of the second transistor stage is connected to the emitter of the transistor (T72) of the third voltage-controlled current source and wherein the first and second transistor stages are wired to a drive circuit (1) controlled by the control voltage ($U_B$) of the voltage-controlled current source and which transmits the pilot signal (P) and wherein the emitters of the transistors (T52, T62, T72) of the first, second and third voltage-controlled current source respectively are connected to a negative pole of an operating voltage source via an emitter resistor ($R_{E5}$, $R_{E6}$, $R_{E7}$).

* * * * *

UNITED STATES PATENT AND TRADEMARK OFFICE
CERTIFICATE OF CORRECTION

PATENT NO. : 5,398,008
DATED : March 14, 1995
INVENTOR(S) : Nissler et al.

It is certified that error appears in the above-indentified patent and that said Letters Patent is hereby corrected as shown below:

At Column 9, line 59, please change "T11, T33)" to --(T11, T33)--.

Signed and Sealed this

Sixth Day of June, 1995

Attest:

BRUCE LEHMAN

*Attesting Officer*    *Commissioner of Patents and Trademarks*